United States Patent [19]
Maas et al.

[11] Patent Number: 5,268,313
[45] Date of Patent: Dec. 7, 1993

[54] METHOD OF MANUFACTURING A SEMICONDUCTOR DEVICE HAVING A SPACER

[75] Inventors: Henricus G. R. Maas; Armand Pruijmboom; Peter H. Kranen; Johanna M. L. Van Rooij-Mulder; Marguerite M. C. Van Iersel-Schiffmacher, all of Eindhoven, Netherlands

[73] Assignee: U.S. Philips Corporation, New York, N.Y.

[21] Appl. No.: 820,454

[22] Filed: Jan. 13, 1992

[30] Foreign Application Priority Data

Jan. 14, 1991 [NL] Netherlands ............... 9100062

[51] Int. Cl.⁵ ........................... H01L 21/265
[52] U.S. Cl. ............................. 437/31; 437/33; 437/228; 437/235; 148/DIG. 10; 148/DIG. 102
[58] Field of Search ............ 437/31, 228, 235, 33, 437/229, 231, 909; 148/DIG. 10, DIG. 102

[56] References Cited

U.S. PATENT DOCUMENTS 4,689,872 9/1987 Appels et al. ............... 437/228
5,100,813 3/1992 Nihira et al. ................ 437/228

*Primary Examiner*—Brian E. Hearn
*Assistant Examiner*—Tuan Nguyen
*Attorney, Agent, or Firm*—Steven R. Biren

[57] ABSTRACT

A method of manufacturing a semiconductor device whereby an spacer is formed from a second layer in a fully self-registering manner after a layer portion of a first layer has been formed. For this purpose, the second layer and a masking layer are provided in that order, which masking layer has a greater thickness next to the layer portion than above it. The portion of the second layer situated above the layer portion and the spacer to be formed is then exposed in that the masking layer is etched back over at least substantially its entire surface. A portion of the masking layer then remains next to the layer portion, which masking layer portion is sufficiently thick for adequately protecting the subjacent portion of the second layer against the treatment which is subsequently carried out and by which the etching resistance of at least the top layer of the exposed portion of the second layer is increased. The non-treated portion of the second layer is then selectively etched relatively to the treated portion in order to form the spacer.

8 Claims, 5 Drawing Sheets

METHOD OF MANUFACTURING A SEMICONDUCTOR DEVICE HAVING A SPACER

BACKGROUND OF THE INVENTION

The invention relates to a method of manufacturing a semiconductor device whereby a layer portion of a first layer is formed on a surface of a semiconductor body, the entire assembly is coated with a second layer from which an spacer is formed and with a masking layer which has a greater thickness next to the layer portion than above it, a treatment is carried out by which the etching resistance is increased in a portion of the second layer, at least in a top layer thereof, situated above the layer portion and the spacer to be formed, while next to the layer portion the masking layer acts as a mask against the treatment, and whereby the untreated portion of the second layer is selectively etched away relative to the treated portion so as to form the spacer.

Such a method, whereby an spacer is formed along the edge of the layer portion in a self-registering manner, is known from a Japanese Patent Application No. 61-129 832. According to the known method, after the masking layer has been provided, ions are implanted over the entire surface, for which such an energy is used that the ions penetrate through the masking layer above the layer portion and enter the top layer, whereas they remain in the masking layer next to the layer portion, where the masking layer is thicker. The undoped portion of the top layer is then etched away relative to the doped portion in trifluoromethane so as to form the etching mask.

A drawback of the known method, however, is that the masking photoresist layer must have a substantially equal thickness all over the layer portion for a satisfactory result, which is often not the case in practice. In many cases the photoresist layer will become gradually thinner from the centre to the edge of the layer portion. Moreover, the exact variation in the photoresist layer depends on a number of factors, among which the topography of the device, and is thus not well controlled. As a result of such thickness variations, it will often be impossible in practice to carry out the implantation in such a way that the ions end up mainly in the top layer everywhere above the layer portion, and in particular at the area of the spacer to be formed, in order to give the desired etching resistance to this top layer.

SUMMARY OF THE INVENTION

The invention has for its object inter alia to provide a method of the kind described above which is more controllable and reproducible.

According to the invention, a method of the kind described above is characterized in that, before the treatment is carried out, the masking layer is etched back over at least substantially its entire surface until the masking layer at the area of the portion of the second layer situated above the layer portion and the spacer to be formed has disappeared at least substantially completely, but is still sufficiently thick next to said area in order to protect the subjacent portion of the second layer against the treatment. Since according to the invention the treatment to increase the etching resistance is not carried out until after the top layer above the layer portion has been exposed, it is counteracted that originally present variations in the thickness of the masking layer adversely affect the formation of the etching mask. The method according to the invention, therefore, is considerably less critical than the known method.

A preferred embodiment of the method according to the invention is characterized in that the layer portion and the second layer are provided in such a manner that the second layer adjoins the edge of the layer portion with a practically vertical portion and in that the masking layer is etched back so far that the surface thereof is at the level of the vertical portion of the second layer. As will be explained in more detail in the description of the drawing below, it is counteracted in this way that fluctuations in etching back of the masking layer influence the width of the spacer. Thus it is possible to determine not only the location but in addition also the width of the spacer accurately in a self-registering manner.

If a single layer is used for the second layer, the material thereof should on the one hand be suitable for the spacer to be formed, but on the other hand it should be possible to increase the etching resistance of the material in an adequate manner. This restricts the material choice for the second layer. A greater freedom of choice is obtained if, for forming the second layer, first a base layer of a first material and then a top layer of a second, different material are provided. In that case a material may be used for the top layer whose etching resistance can be increased, while the material of the base layer may be optimally attuned to the use thereof in the spacer to be formed.

BRIEF DESCRIPTION OF THE DRAWING

The invention will now be explained in more detail with reference to the drawing, in which.

Figure 1:
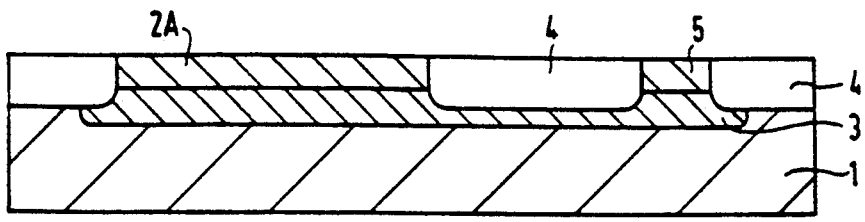
FIGS. 1 to 4, 4A, 4B, and 5 to 9 show successive stages in a first embodiment of the method according to the invention.

The Figures are purely diagrammatic and not drawn to scale. Some dimensions are exaggerated for the sake of clarity. Corresponding parts in the drawings are generally identified with the same reference numerals, and semiconductor regions of the same conductivity type are hatched in the same direction.

DESCRIPTION OF THE PREFERRED EMBODIMENTS

In a first embodiment, see FIG. 1, the starting point is a semiconductor body comprising a p-type substrate 1 of silicon on which an n-type silicon layer 2 is grown epitaxially. Previously the substrate 1 was relatively highly n-type doped locally at the surface, so that a relatively highly doped n-type buried layer 3 is formed at the interface between the substrate and the silicon layer 2 during epitaxial growth. Field oxide regions 4 are subsequently provided in usual manner through local oxidation and the silicon layer 2 is locally relatively highly n-type doped to form a collector contact zone 5, so that the structure of FIG. 1 is obtained. The field oxide regions 4 surround an active region 2a of the silicon layer where in a later stage the transistor will be formed.

Figure 2:
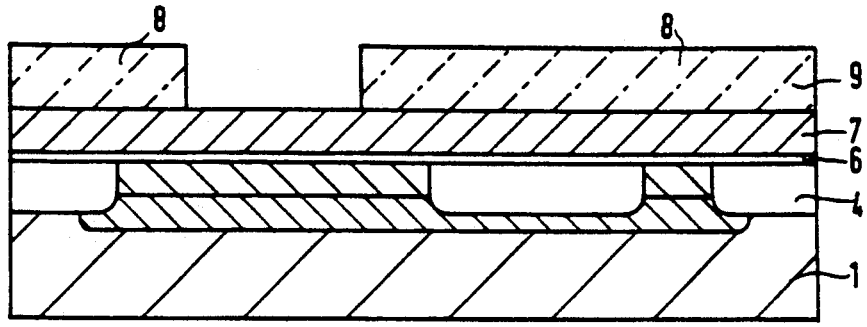

A silicon oxide layer 6 and a polycrystalline silicon layer 7 are successively provided by gas phase deposition (CVD), see FIG. 2. The silicon layer 7 is then p-type doped through ion implantation. If so desired, the layer may also be doped after instead of during the formation.

Figure 3:
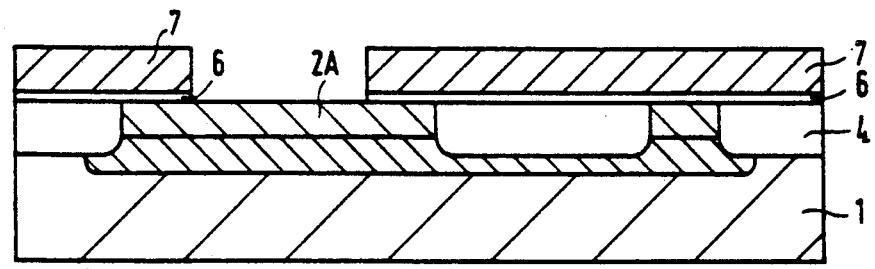

On the silicon layer 7 is provided a photoresist layer from which an etching mask 8 is formed in usual manner by illumination and development. A base connection is etched from the layer 7 by means of the mask 8, after which the exposed portions of the silicon oxide layer 6 are removed, see FIG. 3.

Figure 4:
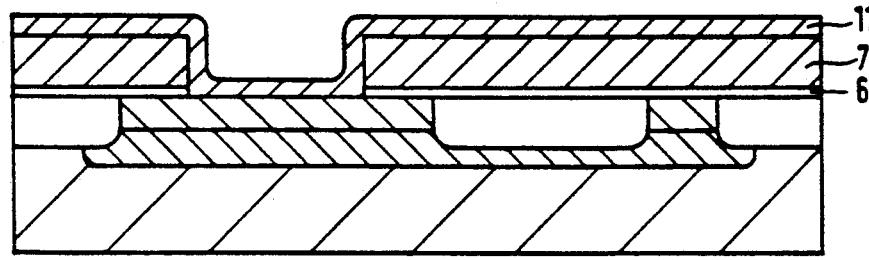

After the surface has been thoroughly cleaned and divested of any natural oxide, a comparatively thin p-type base 11 is provided, see FIG. 4. In this case, the entire assembly is coated for this purpose with a thin p-type silicon layer by gas phase deposition (CVD) in a boron-containing atmosphere, see FIG. 4. It can be achieved by the deposition technique used that the formed layer, at least at the area where the layer is in contact with the epitaxial layer 2, has the desired monocrystalline structure.

As in other growing techniques, such as molecular beam epitaxy (MBE), it is possible with CVD to form an extremely thin layer having a high, sharply defined doping concentration. Thus the base formed in the present example has a thickness of no more than 50 nm and an average boron concentration of approximately $2 \times 10^{18}$ cm$^{-3}$. Such a layer is particularly useful for the base of a bipolar transistor which can achieve a very high switching speed and gain factor as a result. However, a different semiconductor material, such as, for example, silicon-germanium or even a non-semiconductor material, for example, metal, may be used for the base instead of silicon.

An advantage of gas phase deposition is in addition the extremely good step covering which can be achieved thereby. The base 11 in this example forms a continuous layer which extends over the side wall and the surface of the base connection 7. Thus a reliable contact between the base connection 7 on the one hand and the deposited base 11 on the other hand is realized without further measures.

Figure 4A:
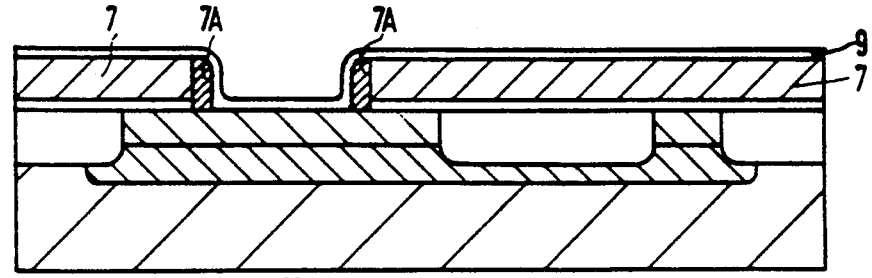
Figure 4B:
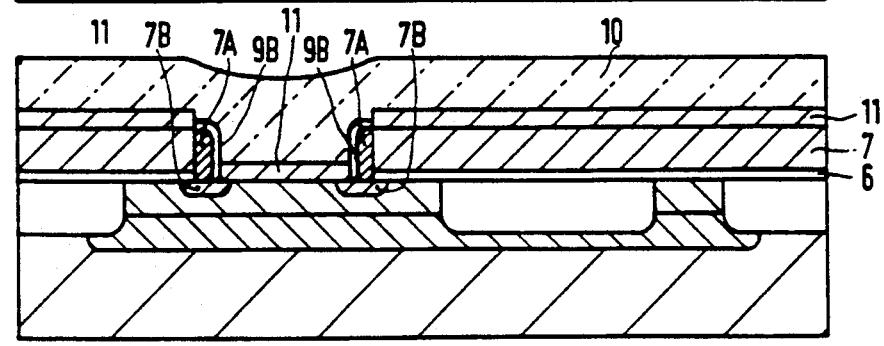

In an alternative embodiment, in which the base is provided by means of molecular beam epitaxy (MBE), the steps of FIGS. 4a and 4b can be followed in order to realize a contact between the base connection 7 and the base 11. During this, before the base is provided, the entire assembly is coated with a p-type doped polycrystalline silicon layer from which an spacer 7A is formed in usual manner by anisotropic etching alongside the base connection. Then a comparatively thin silicon nitride layer 9 is provided, which fully covers the spacer 7A. The horizontal portions of the nitride layer 9 are removed by anisotropic etching. The portion 9B on the spacer 7A, however, remains, see FIG. 4b.

The surface is now thoroughly cleaned, after which a base is grown by molecular beam epitaxy, see FIG. 4b. The nitride layer portion 9B thereby protects the subjacent spacer 7A. It has been found that without such a protective layer portion the spacer 7A is attached during the formation of the base 11 and may even disappear completely.

Owing to the imperfect step covering of molecular beam epitaxy, the base 11 in this case does not lie on the side wall of the base connection 7, 7A. The contact is by contrast realised via a base contact zone 7B in the semiconductor body which is formed there by diffusion from the spacer. The further manufacturing steps are not different from those of the embodiment in which the base is provided by CVD and will be described below with reference to that embodiment.

Figure 5:
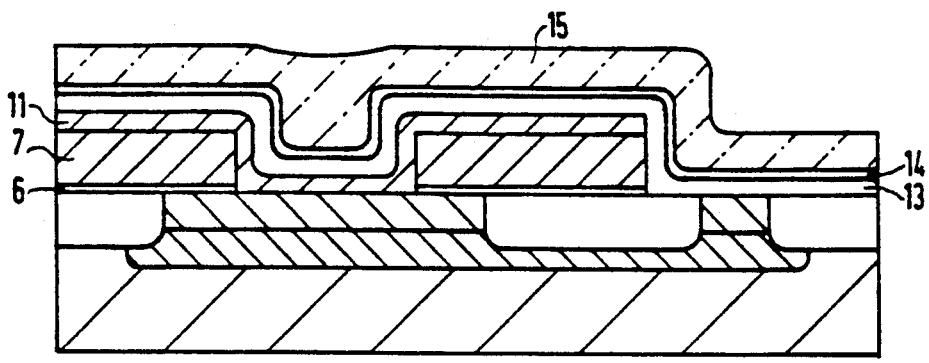

After the base 11 has been patterned in a manner known per se together with the subjacent base connection 7 and oxide layer 6, an spacer of silicon oxide is formed along the edge of the base connection 7 in a fully self-registering manner according to the invention. To that end, see FIG. 5, the entire assembly is coated with an approximately 400 nm thick base layer 13 of silicon oxide and an approximately 200 nm thick top layer 14 of polycrystalline silicon. Both layers may be provided in usual manner, for example, by gas phase deposition. Then an approximately 1000 nm thick masking layer 15 of photoresist is provided over the entire surface.

The photoresist is comparatively viscous, so that unevennesses in the surface such as, for example, between different portions of the silicon layer 7, will be at least partly levelled out. As a result the photoresist layer 15 has a greater thickness between the portions of the silicon layer 7 than above them.

Figure 6:
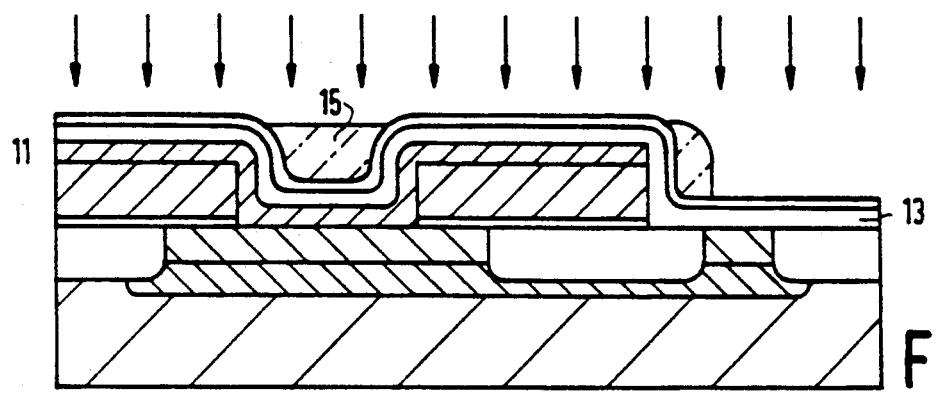

After the masking layer 15 has been provided, this layer 15 is etched back over its entire surface according to the invention. This treatment is continued until the layer has at least substantially disappeared above the silicon layer portions 7. A portion still remains now where the masking layer 15 originally had a greater thickness, see FIG. 6.

An implantation with boron-containing ions is now carried out in such a way that the final average boron concentration is greater than $6 \times 10^{19}$ cm$^{-3}$ in the uncovered portion of the top layer 14. The remaining portion of the masking layer 15, however, is sufficiently thick for protecting the subjacent portion of the top layer 14 adequately against the implantation. After the implantation, the remaining portion of the masking layer 15 is also removed and the implanted boron is baked out to a certain extent, if so desired.

Figure 7:
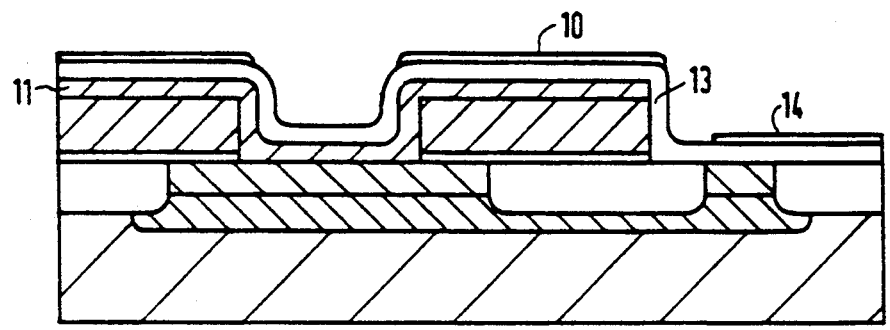

The entire assembly is subjected to an etching treatment in a KOH solution. The boron-doped portions of the top layer 14 are substantially not attacked during this. As a result of the implantation, in fact, the etching resistance of these portions has been increased by more than a factor 50. The substantially undoped portions, on the other hand, are etched away, so that an etching mask 10 is formed from the top layer in a self-registering manner, see FIG. 7.

Figure 8:
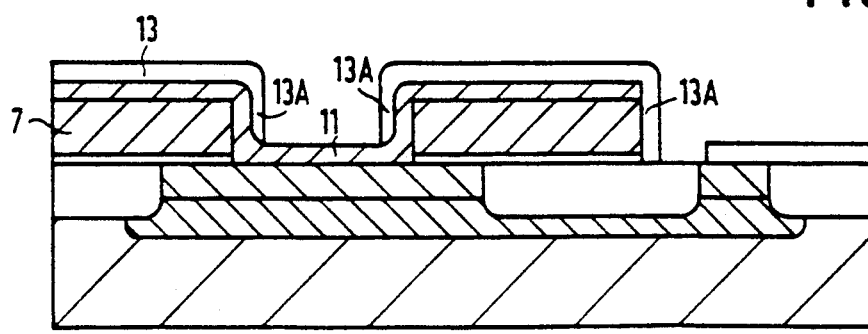

The subjacent silicon oxide layer 13 is etcted anistropically in a plasma of $CHF_3$ and $CF_4$ by means of the etching mask until the base 11 has almost been reached. Then the mask 10 is removed and the base 11 is exposed by a short dip etch in hydrogen fluoride, which has a considerably greater etching selectivity relative to silicon than the plasma used, see FIG. 8. Such a two-stage etching treatment of the oxide layer 13 renders it possible to counteract that the thin base 11 is attacked, which would adversely affect the properties of the transistor. The spacer 13A which is formed from the silicon oxide layer 13 alongside the base connection 7 in this way is sufficiently wide over its entire height for effectively insulating the base 11 laterally, also after the dip etch.

Figure 9:
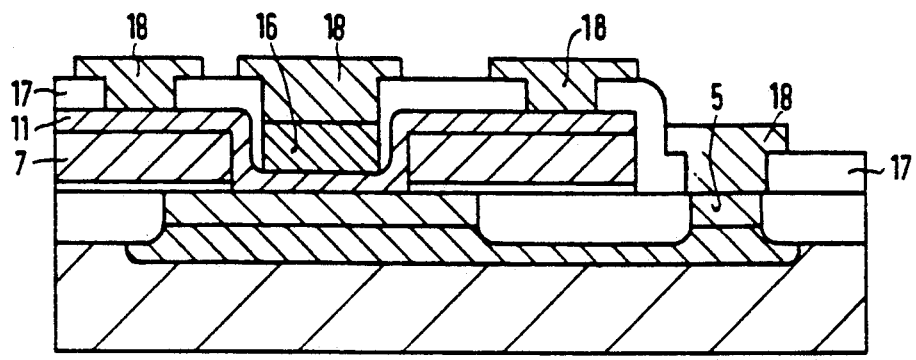

The entire assembly is subsequently covered with an n-type silicon layer, in this case polycrystalline, from which an emitter 16 is formed by masking and etching at the area of the exposed portion of the base 11, see FIG. 9. The emitter 16 and base 11 of the transistor are laterally insulated from one another by the spacer 13A, which was previously provided in a fully self-registering manner by means of the invention.

The surface is coated with a comparatively thick glass layer 17 which is doped with phosphorus and possibly with boron, in which contact windows are etched in usual manner at the areas of the base connection 7, the emitter 16, and the collector contact zone 5. Then the emitter 16, base 11, and collector 5 are provided with aluminum connection electrodes 18. The structure thus obtained is depicted in FIG. 9.

Figure 10:
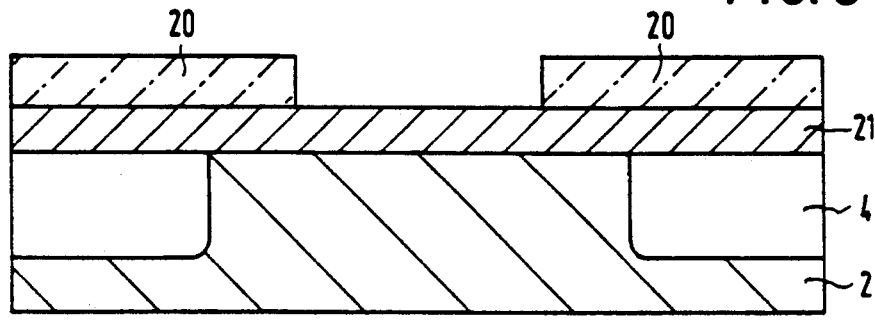
FIGS. 10 to 18 show successive stages of a second embodiment of the method according to the invention.

In a second embodiment, see FIG. 10, the starting point is a semiconductor body of silicon having an n-type surface region 2 in which field oxide regions 4 are formed by local oxidation. A polycrystalline silicon layer 21 is provided over the entire assembly by gas phase deposition (CVD), after which the layer is doped with boron. An etching mask 20 is then provided on the silicon layer 21.

Figure 11:
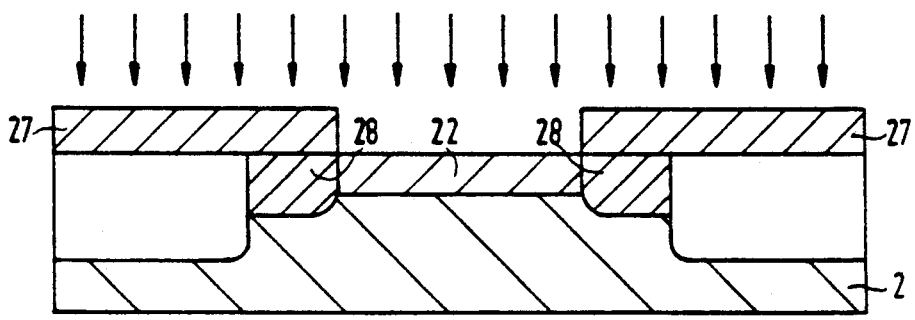

The silicon layer 21 is partly etched away by means of the mask 20, see FIG. 11. The remaining portion forms a base connection 27. While the base connection 27 is masked, the exposed portion of the silicon region 2 is now doped with boron by means of an implantation with $BF^{2+}$ ions. The implanted impurity is then activated in a heat treatment and slightly diffused out, whereby a base 22 is formed. During the heat treatment, in addition, boron diffuses from the base connection 27 into the subjacent silicon region 2, so that a comparatively highly doped base contact zone 28 is created there, see FIG. 11.

Figure 12:
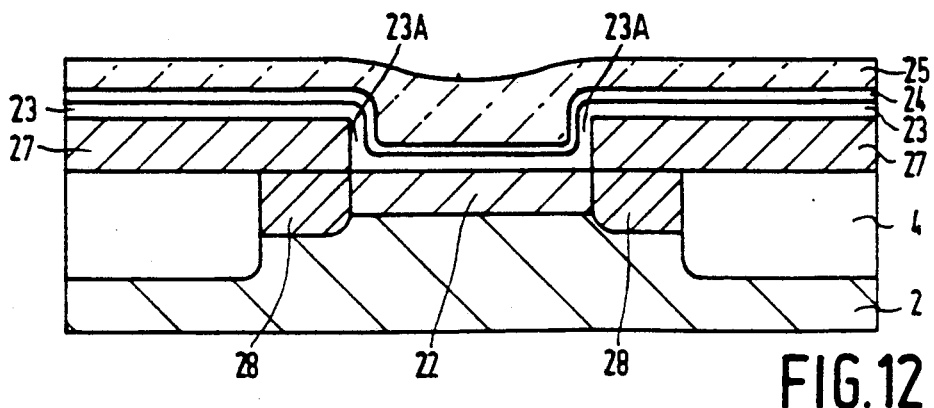

The device is now successively coated with an approximately 400 nm thick base layer 23 of silicon oxide and a silicon top layer 24, see FIG. 12. Then an approximately 1000 nm thick masking layer 25 of photoresist is provided by spinning, which levels out height differences in the surface to some extent and as a result has a greater thickness over the base 22 than over the base connection 27.

Figure 13:
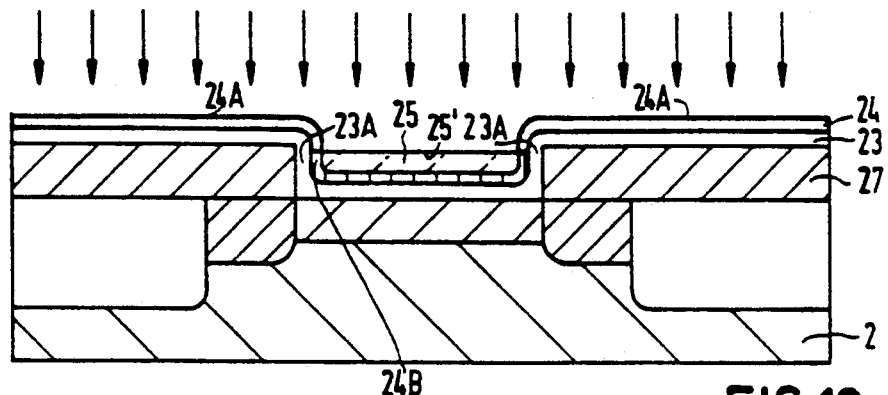

The silicon oxide layer 23 and the base connection 27 are so provided in this embodiment that the silicon oxide layer adjoins the base connection 27 with a practically vertical portion 23A. The masking layer 25 is now etched back so far that the surface 25' thereof is at the level of the said vertical portion 23A, see FIG. 13.

The etching resistance of the now exposed portion of the silicon top layer 24 is subsequently increased in that an implantation with phosphorus ions is carried out and, after the remaining portion of the masking layer 25 has been removed, in that the entire assembly is exposed to an oxidizing atmosphere at low temperature. The implantation is carried out with a dose of approximately $2 \times 10^{16}$ cm$^{-2}$. The remaining portion of the masking layer 25 is sufficiently thick for effectively protecting the subjacent portion of the top layer 25 against the implantation, so that this portion is not or substantially not doped with phosphorus.

Figure 14:
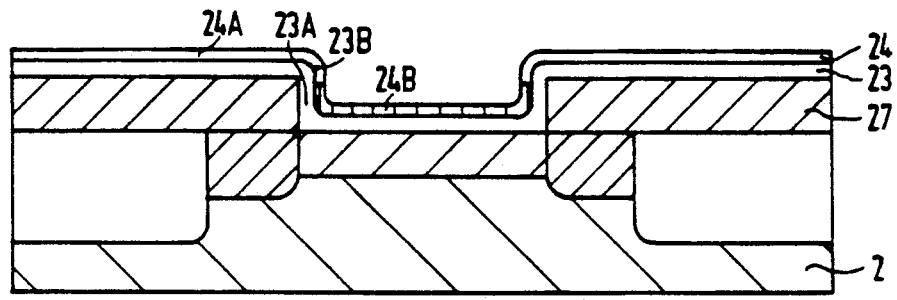

The phosphorus doping considerably increases the oxidation rate of the top layer 24A. During the oxidation, the phosphorus-doped portion of the top layer is converted by oxidation. On the portion of the top layer 24B not or substantially not doped with phosphorus, on the other hand, a considerably thinner oxide layer will be formed, which is subsequently removed by a short etching treatment with hydrogen fluoride. The structure of FIG. 14 is obtained in this way.

Since in this embodiment of the method according to the invention the masking layer 25 is etched back to beyond the curves 23B in the silicon oxide layer 23, it is avoided that incidental fluctuations in etching back of the masking layer 25 affect the width of the phosphorus-doped and then oxidized portion 24B of the top layer and thus the width of the spacer yet to be formed. The spacer as a result can be provided with an extremely accurately defined width. Thus the distance from the emitter, also yet to be formed, to the comparatively highly doped base contact zone 28 can be accurately controlled, which benefits the transistor characteristics and the reproducibility of the method.

Figure 15:
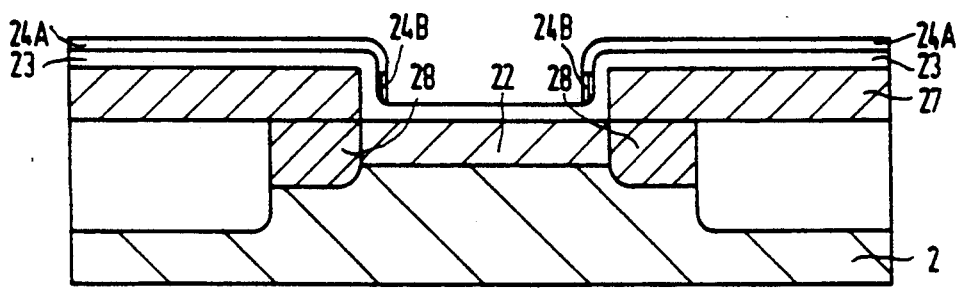

In a dry $CCl_4$ and $Cl_2$ plasma, the non-oxidized and exposed portion 24B of the top layer is removed, see FIG. 15. Since the oxidized portion of the top layer is more resistant to such an etching treatment by approximately a factor 10, this portion is substantially not etched. The oxidized portion 24A of the top layer forms an etching mask which is subsequently used for etching the subjacent silicon oxide layer 23. Before the oxide layer 23 is etched, a short oxidation is carried out in this case in order to oxidize the not yet oxidized portion 24B of the top layer as yet. However, this step may also be omitted, if so desired.

Figure 16:
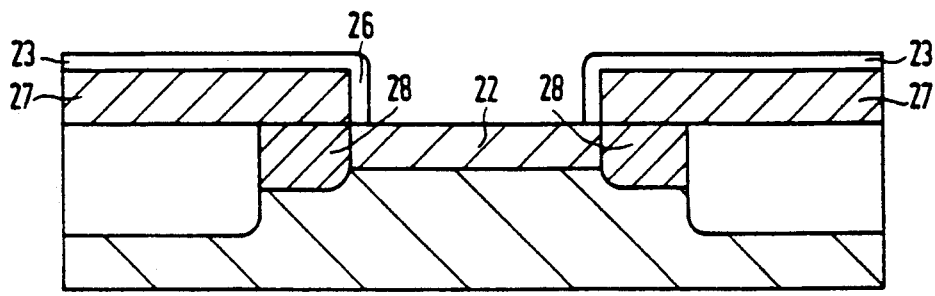

The silicon oxide layer 23 is then etched anisotropically in a $CHF_3$ and $CF_4$ plasma. Initially, only the mask 24A situated above the base connection will be etched thereby, so that the subjacent portion of the silicon oxide layer 23 is protected. The etching treatment is continued until the base 22 is reached and the structure of FIG. 16 is obtained. An spacer 26 of silicon oxide is thus formed in a fully self-registering way on along the inside edge of the base connection 27.

Figure 17:
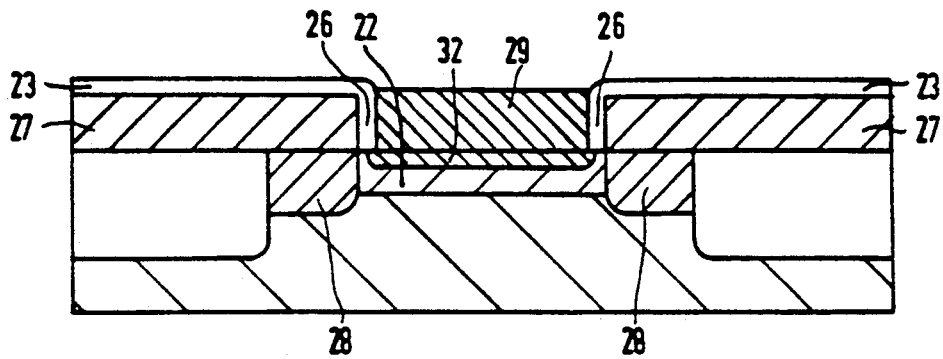

Then a comparatively highly arsenic-doped silicon layer is provided over the entire surface, from which an emitter connection 29 is formed by masking and etching on the base, see FIG. 17. A heat step is then carried out, whereby arsenic diffuses from the connection into the base 22 and an emitter 32 is formed.

Figure 18:
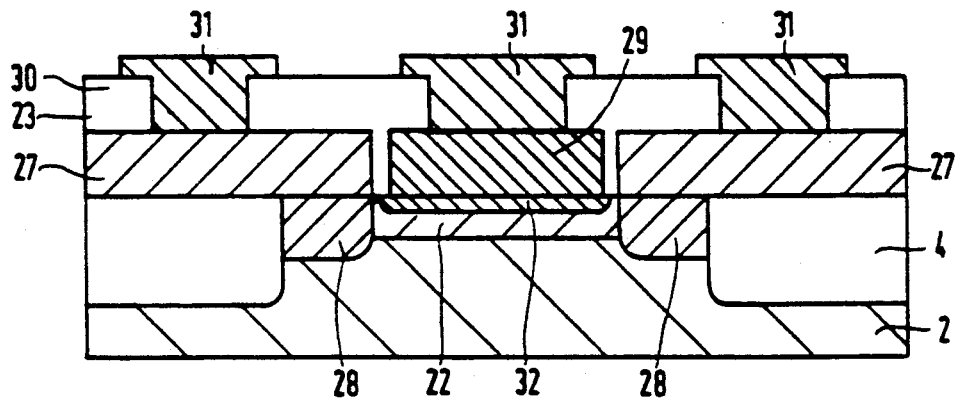

After the entire assembly has been covered with a comparatively thick passivating layer 30, for example, of glass doped with phosphorus and possibly with boron, and after contact windows have been provided therein, aluminum contacts 31 are provided on the base and emitter connections 27, 29. The resulting structure is shown in FIG. 18.

Although the invention was described above with reference to only two embodiments, it will be apparent that the invention is by no means limited to the embodiments given. Many variations are possible for those skilled in the art within the scope of the invention.

Thus a second layer comprising a base layer of a first material and a top layer of a second, different material was used in the examples given each time. The invention may also be used, however, in the case of a second layer which consists of the same material throughout its thickness. If a silicon layer is used for the second layer, for example, an spacer of silicon may be formed therefrom according to the invention in a fully self-registering manner.

Instead of photoresist, moreover, another suitable material may be used for the masking layer, such as, for example, phosphorus glass or silicon oxide formed from TEOS (tetraethyl orthosilicate).

Apart from that, the invention is not limited to methods of manufacturing a bipolar semiconductor device, but it can also advantageously be used for the manufacture of a semiconductor device comprising MOS transistors, possibly combined with bipolar transistors in the same device.

We claim:

1. A method of manufacturing a semiconductor device, comprising:
    forming a layer portion of a first layer on a surface of a semiconductor body to form an assembly;

coating the entire assembly with a second layer from which an insulated spacer is to be formed, and with a masking layer which has a greater thickness next to the layer portion than above it;

etching back the masking layer over at least substantially its entire surface until the masking layer at an area of a portion of the second layer situated above the layer portion and the spacer to be formed is substantially removed, but is still sufficiently thick next to said area to protect a subjacent portion of the second layer against a treatment to be subsequently performed;

then carrying out said treatment, by which etching resistance is increased in at least a top layer portion of the second layer, where it is situated above the layer portion and the insulated spacer to be formed, with the masking layer acting as a mask against the treatment next to the layer portion; and selectively etching away an untreated portion of the second layer relative to the treated portion to form the insulated spacer.

2. A method as claimed in claim 1, characterized in that the layer portion and the second layer are provided in such a manner that the second layer adjoins the edge of the layer portion with a substantially vertical portion and in that the masking layer is etched back so far that the surface thereof is at the level of the vertical portion of the second layer.

3. A method as claimed in claim 1, characterized in that, for forming a second layer, first a base layer of a first material and then a top layer of a second, different material are provided.

4. A method as claimed in claim 1, characterized in that a photoresist layer is used for the masking layer.

5. A method as claimed in claim 1, characterized in that the top layer comprises silicon and that, for forming the etching mask, boron-containing ions are introduced into the exposed portion of the top layer and the portion substantially not doped with boron ions is etched away selectively relative to the doped portion.

6. A method as claimed in claim 1, characterized in that the second layer is provided with an oxidizable top layer and that, for forming an etching mask, an oxidation rate of an top layer in an exposed portion thereof is increased, the top layer is exposed to an oxidizing atmosphere, and the less oxidized portion of the top layer is etched away relative to the more oxidized portion.

7. A method as claimed in claim 1, characterized in that a base of a bipolar transistor is formed from the first layer, that an electrically insulating material is used for the second layer, and that an spacer is formed from the second layer in order to insulate the base from an emitter of the transistor.

8. A method as claimed in claim 7, characterized in that a further spacer of silicon is formed along an edge of a connection before the second layer is provided, that the further spacer is covered with a protecting layer, and that the base is deposited.

* * * * *